ACTIVE PULSE DELAY LINE

Filed Dec. 2, 1966

INVENTORS.
PETER LAAKMANN,
JAMES R. McLENDON,
BY Victor Sepulveda
AGENT.

United States Patent Office 3,463,941

Patented Aug. 26, 1969

3,463,941

ACTIVE PULSE DELAY LINE

James R. McLendon, Richardson, Tex., and Peter Laakmann, Los Angeles, Calif., assignors to Hughes Aircraft Company, Culver City, Calif., a corporation of Delaware Filed Dec. 2, 1966, Ser. No. 598,677

Int. Cl. H03k *17/28*

U.S. Cl. 307—293 5 Claims

ABSTRACT OF THE DISCLOSURE

The disclosed active pulse delay line includes a plurality of transistor switching stages that are sequentially enabled for a time determined by an RC network. When the final switching stage is enabled, regenerator circuitry enables the initial stage. The regenerator circuitry includes a multivibrator triggered by a signal from the final switching stage and providing pulses having a pulse width greater than one-half of the time required for enabling each of the switching stages.

This invention relates to electronic pulse delay systems and more particularly to a novel and improved pulse delay system which provides successive output signals to a plurality of outputs which may be constant in duration and amplitude.

Briefly described, the present invention comprises electronic circuitry including a plurality of switching stages which are sequentially enabled by the circulation of a single pulse. The pulse is delayed in each stage by an RC circuit before a successive switching stage is enabled. When the final bit stage of the plurality of stages is enabled, a regenerative circuit enables the initial bit stage. Therefore, this circuit provides a ring counter which is successively shifted through each stage by a single pulse.

The present invention is useful for multiplexing techniques or the like or for providing outputs to trigger a scan generator or similar devices.

It therefore becomes one object of this invention to provide a novel and improved electronic circuit for providing sequential signals in a timed relationship by a single input pulse.

Another object of this invention is to provide a novel and improved electronic circuit which does not require a clock signal for enabling each output in succession.

Another object of this invention is to provide a novel and improved electronic circuit wherein each output of a plurality of switching stages is delayed in succession.

Another object of this invention is to provide a novel and improved electronic circuit for providing sequential output signals from a plurality of bit stages wherein the delay bit outputs may be of a predetermined time duration.

Another object of this invention is to provide a novel and improved electronic circuit where only the stage that carries the bit is turned on, to conserve power in large delay systems.

Another object of this invention is to provide a novel and improved multiplexing circuit which provides successive outputs by circulating a single pulse.

Another object of this invention is to provide a novel and improved multiplexing circuit which includes a regenerator capable of absorbing extraneous noise pulses and thereby eliminating ambiguous outputs.

Another object of this invention is to provide a novel and improved electronic delay circuit which is insensitive to transistor parameters and temperature.

These and other objects and advantages of this invention will become more apparent to those skilled in the art when taken into consideration with the following detailed description and, accompanying drawing illustrating a preferred embodiment of this invention and wherein.

Figures 1, 2:
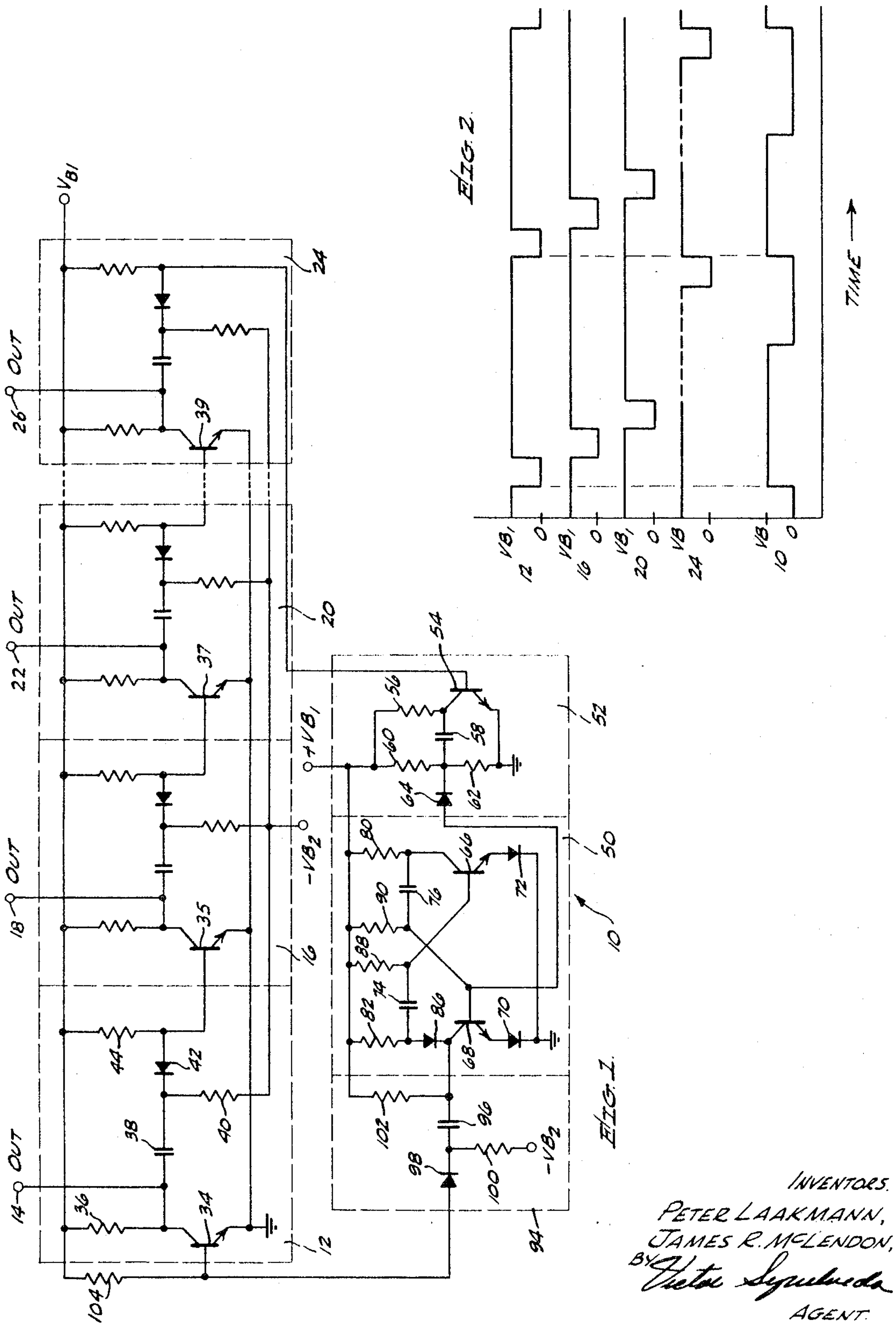
FIGURE 1 is a block diagram illustrating a preferred embodiment of this invention.
FIGURE 2 is a timing diagram showing the various outputs of the bit stages of FIGURE 1.

Turning now to the more detailed description of this invention and with reference to FIGURE 1, a plurality of switching stages 12, 16, 20, 24 is coupled in a loop configuration which includes a regenerator circuit 10, which has an input circuit 52 and an output circuit 94, the output circuit 94 being coupled to a switching stage 12. Switching stage 12 comprises electronic circuitry including a switching means and an RC charging network to determine the state of an output signal at terminal 14 and the state of a next switching stage 16. Regenerator circuit 10 provides the input pulse to switching stage 12. When stage 12 is enabled by the pulse, a pulsed output signal appears at terminal 14. Then, after the pulse from circuit 10 has ended, the following switching stages 16, 20, 34 are each in turn enabled for a specified charging time depending on their RC charging circuit. When the pulse from circuit 10 has ended, stage 12 is no longer enabled and switching stage 16 is enabled and an output pulse is provided on output terminal 18. Subsequently the next successive switching stage 20 is enabled. The output pulses of each of the stages at their respective output terminals 14, 18, 22, 26 are illustrated in FIGURE 2.

When all of the switching stages 12, 16, 20, 24 have successively been enabled and after the final switching stage 24 has been enabled, the regenerator circuit 10 then provides a signal to the initial switching stage 12.

Switching stage 12 comprises a transistor 34 having its emitter electrode coupled to ground, its collector coupled to a voltage source $V_{B1}$ through a current limiting resistor 36; the value of $V_{B1}$ may be 25 volts and resistor 36 may have a resistance of 680 ohms. The collector of transistor 34 is also coupled to one terminal of a capacitor 38 the other terminal of capacitor 38 is coupled to a voltage source $-V_{B2}$ through a resistor 40. The value of $-V_{B2}$ may be $-75$ volts and the resistance of resistor 40 may be 47K ohms. A diode 42 has its cathode electrode coupled between capacitor 38 and resistor 40. The anode electrode of diode 42 is coupled to $V_{B1}$ through current resistor 44 which may have a resistance of 47K ohms. The anode of diode 42 is coupled to the input (the base electrode of a transistor 35) of the next switching stage 16.

All other switching stages 16, 20, 24 may be electrically the same as the described stage 12, the input of each stage being coupled directly to the transistors, such as transistor 34, for example, and output emanating from the diodes, as diode 42 for example. The description and operation of the various components of the regenerator circuit 10 including a signal delay device 94, a multivibrator 50, and a signal spike initiating means 52, is set forth below.

In operation of the switching stages 12, 16, 20, 24 transistors 34, 35, 37, 39 are in a normally off condition because the current path between $V_{B1}$ and $-V_{B2}$ through resistor 44, diode 42, and resistor 40 (through analogous circuit elements in the other stages) maintains the respective bases of the transistors 34, 35, 37, 39 at a negative voltage with respect to ground potential. Taking stage 12 as an example, when transistor 34 is in the off condition, capacitor 38 may become charged to 32 volts, for example, since one terminal of the capacitor 38 is at approximately $+25$ volts due to $V_{B1}$, and the other terminal of capacitor 38 is at approximately $-7$ volts since the base-emitter Zener breakdown voltage of transistor 35 of the next stage is about 6.3 volts due to the negative current supplied by $V_{B2}$ and resistor 40 plus approximately 0.7 volt due to the voltage drop across diode 42. A pulse applied at the base electrode of transistor 34, from $V_{B1}$ through resistor 104, will turn on transistor 34 discharging capacitor 38 to about 7 volts through the base emitter junction of the transistor of the following stage 16 (one terminal of capacitor 38 being at a −7 volts and the other terminal of capacitor 38 being grounded through on transistor 34).

Assuming transistors 34, 35, 37 and 39 are in the off state when transistor 68 of regenerator 10 is turned off by a trigger pulse generated by spike initiator 52 and as a result diode 98 is back-biased, transistor 34 is turned on because of current supplied by $V_{B1}$ and resistor 104. Capacitor 38 discharges through diode 42 and the base emitter junction path of transistor 35 to about 7 volts. Transistor 34 remains turned on until the voltage at the junction of the cathode of diode 98, resistor 100 and capacitor 96 crosses approximately zero volts, which forward biases diode 98. This turns off transistor 34. The operation of each successive stage is the same. Since the terminal of capacitor 38 connected to the collector electrode of transistor 34 is no longer coupled to ground because transistor 38 is in its off state, the voltage at that terminal rises from approximately zero to approximately 25 volts (due to $V_{B1}$). At the other terminal of capacitor 38 a voltage of +18 (25−7) volts appears. Diode 42 becomes back biased because of the +18 volts at its anode, and transistor 35 turns on because of the current supplied by $V_{B1}$ and resistor 44. Capacitor 38 charges by means of $-V_{B2}$ through resistor 40. Transistor 35 remains in its on state until the common junction of resistor 40, capacitor 38 and diode 42 changes from approximately +18 to 0 volts. When this common junction is at approximately zero volts, transistor 35 is turned off and transistor 37 is turned on, etc. The forward drop of diode 42 cancels the base-emitter voltage drop of the driven stage. The transistor 35 delay time is the time it takes the aforesaid junction to change from plus 18 (25−7) volts to zero, at least to a first approximation. A more accurate analysis would include the additional time required to reduce the forward bias of the transistor in its on state sufficiently for complete turnoff. However, in the illustrated circuit, errors due to variables, other than the RC time constant of the resistor 100 (40) and the capacitor 96 (38) do not account for more than 10% of the delay time.

Stability of the delay voltages as a function of temperature is excellent since the transistors and switching stages are completely isolated from the RC circuits during their on conditions. The ratio of the resistance of resistor 44 to the resistance of resistor 36 should be high and the base current in the on condition stage should be small compared to the current provided by resistor 40.

Regenerator circuit 10 supplies the initial turn-on current from the output of the final switching stage 24 to the initial input stage 12. The regenerator 10 is also provided to prevent more than a single pulse from circulating through the switching circuits causing ambiguities in the output.

The regenerator 10 is in effect an unsymmetrical astable multi-vibrator 50 which is reset by the output of the last switching stage 24 to synchronize its output with the input of the next switching stage 12. The pulse width of the regenerator 10 is best chosen between a multiple of ½ and 1 of the total line delay time of the switching stages 12, 16, 20 and 24. This provides that only one pulse at a time can circulate through the aforesaid switching stages. Any other pulse due to noise, interference, etc. can not maintain more than ½ the line delay in operation for more than one cycle. However, any two pulses spaced less than ½ the line delay can only re-set regenerator 10 once. Any noise pulse will therefore either eliminate the original pulse or be eliminated itself. The regenerator 10 is self-starting and will provide the first circulating pulse automatically.

Regenerator 10 comprises a signal spike initiating means 52 for resetting the astable multi-vibrator 50. This spike initiator 52 comprises a transistor 54 having the output of the final stage 24 coupled to its base electrode and having its emitter electrode coupled to the ground reference and having its collector electrode coupled to $V_{B1}$ through the current limiting resistor 56. The collector of transistor 54 is coupled to one end of a capacitor 58, the other end thereof being coupled to a voltage divider which comprises a resistor 60 which is coupled between capacitor 58 and $V_{B1}$ and a resistor 62 coupled between the capacitor 58 and ground reference. Also coupled to the common junction of the capacitor 58 and resistors 60, 62 is a diode 64.

The astable multi-vibrator 50 is of the typical type found in the literature and is well known to those skilled in the art; and one example of which comprises a pair of transistors 66 and 68 having their emitters coupled together and to a ground reference. By this embodiment a pair of diodes 70 and 72 are coupled between the emitter electrodes of the transistors 66 and 68 and the ground reference to increase the reverse base voltage capabilities thereof. The base of transistor 66 is coupled to the collector of transistor 68 through a series coupled capacitor 74. Likewise, the base of transistor 68 is coupled to the collector of transistor 66 through a series coupled capacitor 76. The anode of diode 64 of the spike initiator 52 is coupled between the base of transistor 68 and capacitor 76. The collector of transistor 66 is coupled to $V_{B1}$ through a current limiting resistor 80 and the collector of transistor 68 is coupled to the $V_{B1}$ through the current limiting resistor 82. Coupled between the collector of transistor 68 and the junction of the resistor 82 and the capacitor 74 is an isolation diode 86. A resistor 88 is coupled between the base of transistor 66 and $V_{B1}$. A resistor 90 is coupled between the base of transistor 68 and $V_{B1}$.

A signal delay device 94 is coupled between the collector of transistor 68 and the input of the first switching stage 12 and particularly to the base of transistor 34 thereof. This delay device comprises a capacitor 96 coupled to the cathode of a diode 98. The junction between diode 98 and capacitor 96 is coupled to $-V_{B2}$ through a resistor 100. A resistor 102 has one end coupled to $V_{B1}$ and the other end coupled between the collector of transistor 68 and capacitor 96. Resistor 104 is coupled between the anode of the diode 98 and $V_{B1}$. Capacitor 96, diode 98, and resistors 100, 102, 104 are electrically analogous to capacitor 38, diode 42, and resistors 40, 44, 36 of stage 12 (and corresponding elements of the other stages). These circuit elements, in part, bias the transistor and comprise the RC delay circuit that regulates the length of the pulse in each of the stages.

Spike initiator 52 initiates a single spike signal when transistor 39 changes from the on to the off state. This spike starts the astable multi-vibrator initiating its first pulse which in turn initiates the first switching stage 12, and continues to operate free-running with a pulse width between ½ and 1 of the total line delay time of the switching device as shown in FIGURE 2 but will be re-set to its original time delay by the next output from the last switching stage 24. Thus keeping in synchronization the last stage 24 and first stage 12 of the switching stages. The regenerator 10, as is inherent with astable multi-vibrators, can generate its original pulse automatically and give the desired pulse length.

Thus the objects of this invention are accomplished in that sequential signals in a timed relationship are presented to the outputs of the switching stages by the circulation of a single pulse. This circuit does not require the precision clock circuits as does prior art multiplexing devices. Each stage of the switching device remains in a quiescent state until enabled, thus avoiding the requirement for a high power dispatch.

It should be understood that this embodiment only shows four switching stages. In actual practice, a comparatively larger amount of switching stages have been used in a multiplex application. Therefore it should not be limited to the four stages as described in the embodiment.

Having thus explained one embodiment of this invention, what is claimed is:

1. An electrical pulse delay system, comprising:

a plurality of switching stages coupled in series, each of said stages including a transistor having a collector electrode, an emitter electrode and a base electrode; each emitter electrode connected to a reference potential; an electrical power supply having one terminal coupled to each said collector electrode; regenerator circuitry coupled between the last stage and the first stage of said plurality; and delay means coupled between successive ones of said stages for delaying the successive switching of said transistors, each said delay means including a capacitor and a diode coupled in series between the collector electrode of one stage and the base electrode of a successive stage, and a resistor having one terminal coupled to the junction between said diode and said capacitor and the other terminal coupled to another terminal of said power supply.

2. The electrical pulse delay system defined in claim 1 wherein the junction of said diode and said base electrode in each of said switching stages is resistively coupled to said one terminal of said power supply.

3. An electrical pulse delay system comprising:

a plurality of switching stages coupled in a series ring so that each of said stages is coupled between two other ones of said stages, each of said stages including a switching transistor having non-conducting and conducting states;

biasing means for normally maintaining each of said transistors in said non-conducting state;

means coupled between each of said stages for sequentially and in a timed relationship switching one of said transistors to said conducting state; and pulse regenerator means having first and second pulsing states and being coupled between two of said stages for applying a pulse to one of said stages during said first pulsing state; and said regenerator means remaining in said first state for a time greater than one-half of the total time required for a pulse to circulate through said plurality of stages.

4. An electrical pulse delay system comprising:

a plurality of switching stages coupled in series, each of said stages including: a transistor having collector, emitter and base electrodes, said collector electrode being resistively coupled to a first power supply terminal and said emitter electrode being coupled to a second power supply terminal; a voltage divider network including a first and second resistors and a diode coupled in series between said first and a third power supply terminal, a capacitor coupled between said network and said collector electrode; said network also being coupled to the base electrode of the transistor of the succeeding stage; and regenerator means coupled between the first and last stages of said plurality for initiating a pulse and for ensuring that only one pulse is within said system.

5. An electrical pulse delay system as claimed in claim 4 wherein said first terminal is at a positive electrical potential with respect to said second terminal and said third terminal is at a negative electrical potential with respect to said second terminal; said first resistor being coupled between said first terminal and the anode of said diode, said second resistor being coupled between the cathode of said diode and said third terminal, said base electrode of the transistor of the succeeding stage being coupled to said anode of said diode, and said capacitor being coupled to said cathode of said diode.

References Cited

UNITED STATES PATENTS

| | | | |
|---|---|---|---|
| 2,402,916 | 6/1946 | Schroeder | 328—55 |
| 2,933,625 | 4/1960 | Townsend et al. | 307—293 |
| 3,047,817 | 7/1962 | Schneider | 331—57 |
| 3,121,846 | 2/1964 | Wormser | 331—57 XR |

JOHN S. HEYMAN, Primary Examiner

JOHN ZAZWORSKY, Assistant Examiner

U.S. Cl. X.R.

307—223, 268; 328—55, 62; 331—113

UNITED STATES PATENT OFFICE

CERTIFICATE OF CORRECTION

Patent No. 3,463,941 August 26, 196

James R. McLendon et al.

It is certified that error appears in the above identified patent and that said Letters Patent are hereby corrected as shown below:

Column 2, line 21, "34" should read -- 24 --. Column 6, line 11, cancel "a".

Signed and sealed this 30th day of December 1969.

(SEAL)
Attest:

Edward M. Fletcher, Jr.
Attesting Officer

WILLIAM E. SCHUYLER, J
Commissioner of Paten

UNITED STATES PATENT OFFICE

CERTIFICATE OF CORRECTION

Patent No. 3,463,941 August 26, 196

James R. McLendon et al.

It is certified that error appears in the above identified patent and that said Letters Patent are hereby corrected as shown below:

Column 3, line 38, "stage" should read -- transistor 35 --; line 39, "transistor 35" should read -- stage --.

Signed and sealed this 10th day of March 1970.

(SEAL)
Attest:

Edward M. Fletcher, Jr.
Attesting Officer

WILLIAM E. SCHUYLER, JI
Commissioner of Patent